United States Patent [19]

Lloyd

[11] Patent Number: 4,982,118
[45] Date of Patent: Jan. 1, 1991

[54] DATA ACQUISITION SYSTEM HAVING A METASTABLE SENSE FEATURE

[75] Inventor: Randahl B. Lloyd, Portland, Oreg.

[73] Assignee: Tektronix, Inc., Beaverton, Oreg.

[21] Appl. No.: 450,803

[22] Filed: Dec. 13, 1989

[51] Int. Cl.$^5$ ...................... H03K 17/18; H03K 19/03
[52] U.S. Cl. .................................... 307/480; 307/481; 307/272.1; 307/362; 341/122
[58] Field of Search ................ 341/122; 307/480, 481, 307/272.1, 362

[56] References Cited

U.S. PATENT DOCUMENTS 4,686,391  8/1987  Gudaitis .............................. 307/354
4,851,710  7/1989  Grivna ................................. 307/269

Primary Examiner—Stanley D. Miller
Assistant Examiner—Andrew Sanders
Attorney, Agent, or Firm—Peter J. Meza

[57] ABSTRACT

A data acquisition system suitable for use in a SAR type A/D converter has a metastable sense feature capable of sensing and resolving a metastable condition in the input latch structure of a SAR in order to enable the acquisition of each bit of a digital output word within no more than two clock cycles. In one embodiment the data acquisition system includes a master latch having an input for receiving a digital input signal and a plurality of input latches wherein the inputs of the input latches are coupled together and to the output of the master latch. A sense latch is further included wherein the input of the sense latch is coupled to the output or sense node in the master latch for sensing a metastable condition with the master latch. A plurality of secondary latches is included wherein the inputs of the secondary latches are coupled together and to the output of the sense latch. A logic circuit coupled to the outputs of the input latches and to the outputs of the secondary latches passes the outputs of the input latches directly to a system output if no metastable condition is sensed in the master latch. If a metastable condition is sensed in the master latch, the current bit output is forced to a logic one, more significant bit outputs are unaffected, and less significant bit outputs are forced to a logic zero, thus terminating the data acquisition of the current digital input signal.

16 Claims, 4 Drawing Sheets

DATA ACQUISITION SYSTEM HAVING A METASTABLE SENSE FEATURE

This invention is in the field of data acquisition systems and is more particularly related to the latch portion of a successive approximation register ("SAR").

This application is related to my copending patent application entitled "Metastable Sense Circuit" Ser. No. 450802.

A SAR type analog to digital ("A/D") converter is shown in a highly simplified block diagram in FIG. 1. The SAR A/D converter 10 includes a comparator 12 coupled through a resistor 11 to an analog input signal source at positive input terminal 20. The digital output of the comparator 12 is passed to the input of a SAR 14 that is clocked by a master clock signal CLK received at clock input terminal 22. The output of the SAR 14 is a series of bits, the most significant bit being provided on line 32, through less significant bits on lines 34 and 36, until the least significant bit is provided on line 38. Only four bits are shown in FIG. 1, but the SAR 14 may have any number of output bits. The digital output of the SAR 14 is coupled to the input of a digital to analog ("D/A") converter 18. The output of D/A converter 18 is coupled to the positive input of comparator 12 on line 25 and applies several binarily weighted current sources. The total current applied at the positive input changes with each clock cycle as successive bits are resolved and acquired. The reference voltage at the negative input terminal is typically referenced to ground. The output of the SAR 14 on lines 32-38 is buffered by an output buffer stage 16 to provide a buffered output on output terminals 24, 26, 28, and 30 designated DIG1 (most significant bit), DIG2, DIG3, and DIG4 (least significant bit).

The SAR 14 used in the prior art A/D converter 10 of FIG. 1 is well known in the art as a special purpose serial-to-parallel converter that includes a number of latches and attendant logic and control circuits. The SAR may be integrated with the comparator 12, D/A converter 18, and output buffer stage 16 on one integrated circuit such as the AD575 A/D converter manufactured by Analog Devices, Inc., or may be a separate integrated circuit such as the DM 2502 SAR manufactured by National Semiconductor, Inc. of Santa Clara, Calif. or the ZY25HCT04 SAR manufactured by Zyrel, Inc.

The latch portion of the SAR 14, together with the comparator 12 and output buffer stage 16 is shown in FIG. 2. For a better understanding of the prior art latch structure, the attendant logic and control circuitry has been removed from the SAR 14, as well as the D/A converter 18. Thus FIG. 2 shows a prior art data acquisition system 40 having a comparator 12 for receiving an analog input signal at positive input terminal 20 and for receiving a reference input signal at negative input terminal 25. The output of comparator 12 is a digital signal that is a logic one when the analog input signal is greater than the reference input signal, and is a logic zero when the analog input signal is less than the reference input signal. The output of comparator 12 is latched into four D type input latches 42, 44, 46 and 48. Each latch has a D input, a Q output, and clock inputs, CLK1-CLK4, for receiving a delayed strobe clock derived from the master clock signal CLK shown in FIG. 1. Therefore, the output of the comparator 12 is latched into input latch 42 when CLK1 is a logic one, the output of the comparator 12 is latched into input latch 44 when CLK2 is a logic one, each successive latch latching the output of the comparator 12 upon being clocked by a respective delayed strobe clock signal. The Q output of each latch 42-48 is buffered by the buffer output stage 16 that includes individual buffer stages 16a through 16d to provide a buffered output on output terminals 24, 26, 28, and 30 designated DIG1, DIG2, DIG3, and DIG4.

The prior art data acquisition system 40 of FIG. 2 forms the central portion of a SAR type A/D converter and resolves each bit within one clock cycle of the master clock signal as long as there exists a sufficient difference between the analog input signal and the reference input signal. However, if the analog input signal and the reference input signal are approximately equal, the output of the comparator may be neither a logic one nor a logic zero. In turn, the input latches 42-48 will not resolve this invalid logic state produced by the comparator within one clock cycle, resulting in a metastable condition. The prior art technique used to solve the metastable condition is to allow the input latches sufficient time to resolve the invalid logic state provided by the comparator 12. However, the extra time significantly increases the total acquisition time of the data acquisition system and, consequently, the A/D converter.

What is desired is a data acquisition system that can detect and resolve a metastable condition in the input latch structure of a SAR and acquire each bit in the digital output word within no more than two clock cycles.

SUMMARY OF THE INVENTION

In accordance with the present invention, a data acquisition system suitable for use in a SAR type A/D converter has a metastable sense feature capable of sensing and resolving a metastable condition in the input latch structure of a SAR in order to enable the acquisition of each bit of a digital output word within no more than two clock cycles.

In a first embodiment the data acquisition system includes a plurality of input latches wherein the inputs of the input latches are coupled together to receive a digital input signal. A plurality of sense latches is further included wherein the inputs of the sense latches are coupled to the output or sense node in the respective input latch for sensing a metastable condition within each respective input latch. A logic circuit coupled to the outputs of the input latches and to the outputs of the sense latches passes the outputs of the input latches directly to a system output if no metastable condition is sensed in one of the input latches. If a metastable condition is sensed in one of the input latches, the current bit output is forced to a logic one, more significant bit outputs are unaffected, and less significant bit outputs are forced to a logic zero, thus terminating the data acquisition of the current digital input signal.

In a second embodiment the data acquisition system includes a master latch having an input for receiving a digital input signal and a plurality of input latches wherein the inputs of the input latches are coupled together and to the output of the master latch. A sense latch is further included wherein the input of the sense latch is coupled to the output or sense node in the master latch for sensing a metastable condition within the master latch. A plurality of secondary latches are included wherein the inputs of the secondary latches are coupled together and to the output of the sense latch. A logic circuit coupled to the outputs of the input latches and to the outputs of the secondary latches passes the outputs of the input latches directly to a system output if no metastable condition is sensed in the master latch. If a metastable condition is sensed in the master latch, the current bit output is forced to a logic one, more significant bit outputs are unaffected, and less significant bit outputs are forced to a logic zero, thus terminating the data acquisition of the current digital input signal.

DESCRIPTION OF THE PREFERRED EMBODIMENTS

Figure 3:
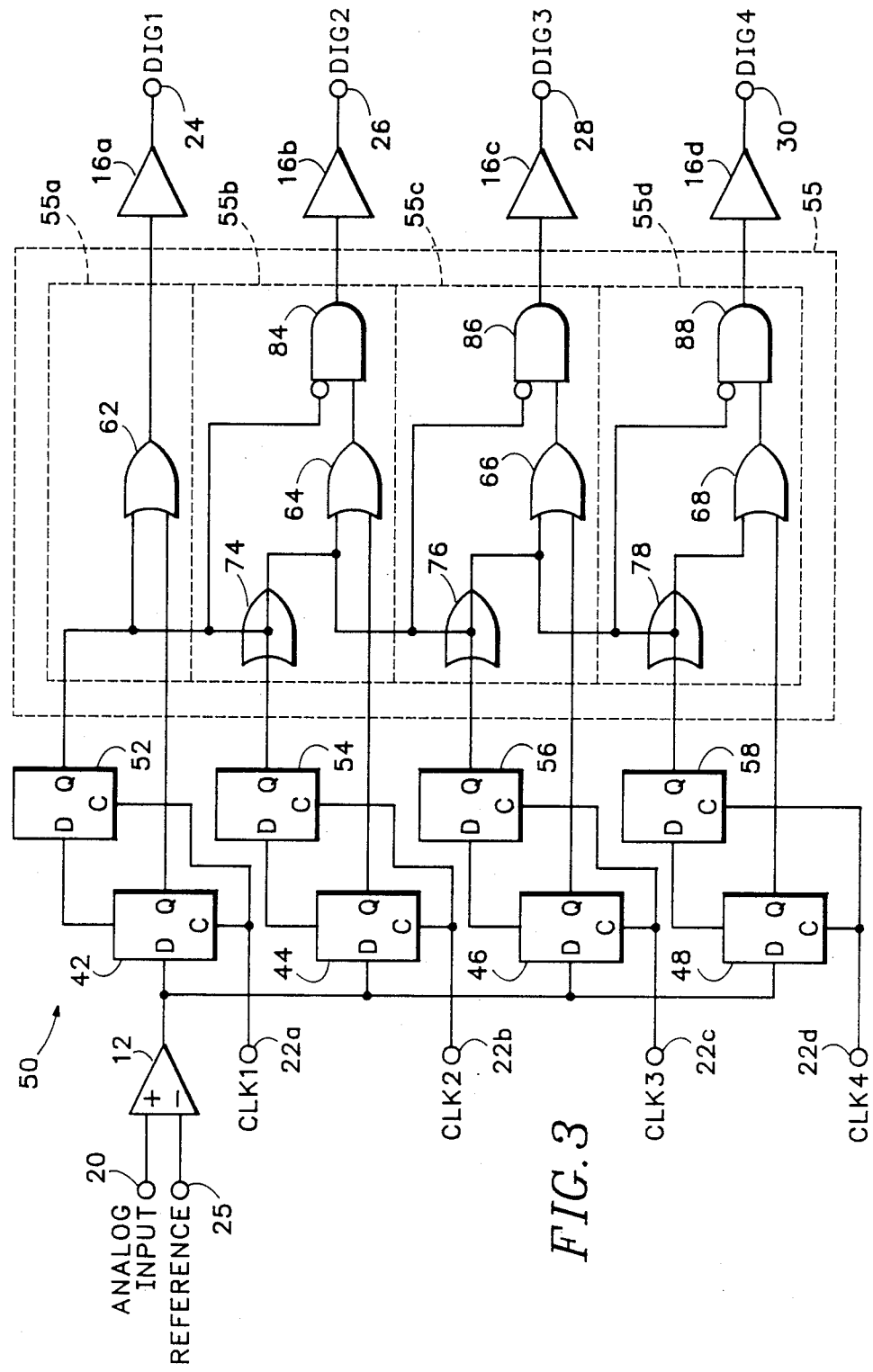
FIG. 3 is a schematic block diagram of a first embodiment of a data acquisition system having a metastable sense feature according to the present invention.

A first embodiment of a data acquisition system having a metastable sense feature is shown in FIG. 3. The data acquisition system 50 includes a plurality of D type input latches 42, 44, 46, and 48 each having a D input and a Q output. The inputs of the input latches 42, 44, 46, and 48 are coupled together to receive a digital input signal provided by the comparator 12. The comparator 12 has a positive input coupled to an analog input signal source through terminal 20 and a negative input coupled to a reference input signal source through terminal 25. The outputs of the input latches 42, 44, 46, and 48 provide a first digital word in response to the digital output of comparator 12 and the logic state of delayed strobe clock input signals CLK1, CLK2, CLK3, and CLK4 received on the clock input, C, of each respective input latch on terminals 22a-22d. In the four bit system shown in FIG. 3, the first digital word is defined by a most significant bit at the output of input latch 42 through a least significant bit at the output of input latch 48.

The data acquisition system 50 further includes a plurality of sense latches 52, 54, 56, and 58 each having a D input and a Q output. A sense latch suitable for use in data acquisition system 50 is fully described in my copending patent application Ser. No. 450802. The inputs of the sense latches 52, 54, 56, and 58 are coupled to the output or suitable sense node in the respective input latch 42, 44, 46, or 48 for sensing a metastable condition within each respective input latch. The outputs of the sense latches 52, 54, 56, and 58 provide a second digital word in response to the sensed metastable condition of each input latch.

A logic circuit 55 is coupled to the outputs of the input latches 42, 44, 46, and 48 and to the outputs of the sense latches 52, 54, 56, and 58 for passing the first digital word to a system output if no metastable condition is sensed in one of the input latches. Alternatively, if a metastable condition is sensed in one of the input latches a third digital word is provided to the system output. The third digital word is defined by a logic one at the current bit output, the more significant bits are unaffected, and the less significant bits are forced to a logic zero, thus terminating the data acquisition of the current digital input signal.

The logic circuit 55 of data acquisition system 50 includes four exclusive-or ("XOR") gate cells 55a, 55b, 55c, and 55d each having a first input, a second input, and an output, the first input of each XOR gate being coupled together. The first input of the first XOR gate cell 55a is coupled to the output of the first sense latch 52, and the second input is coupled to the output of the first input latch 42, wherein the output of the XOR gate cell 55a represents the most significant bit of the third digital word. Similarly, coupled to the output of the second sense latch 54, and the second input is coupled to the output of the second input latch 44, wherein the output of the XOR gate cell 55b represents the next most significant bit of the third digital word designated DIG2 on terminal 26. The coupling of the XOR gate cells to the respective sense and input latches continues to include the fourth XOR gate cell 55d. The first input of the fourth XOR gate cell 55d is coupled to the output of the fourth sense latch 58, and the second input is coupled to the output of the fourth input latch 48, wherein the output of the fourth XOR gate cell 55d represents the least significant bit of the third digital word designated DIG4 on terminal 30.

The logic circuit operates by rippling the logic one indication from a sense latch to less significant bit XOR cells. Since the most significant bit DIG1 is not affected by a more significant bit, the first XOR gate cell 55a is simply an OR gate 62 that passes either the Q output of input latch 42 or the metastable indication from sense latch 52. However, the remaining XOR gate cells 55b, 55c, and 55d each include an OR gate 64, 66, and 68 and an AND gate 84, 86, 88 having a noninverting and an inverting input. The inverting input of each AND gate 84, 86, 88 is coupled to one input of the respective OR gate 64, 66, 68 to form the first input of the XOR gate cell 55b, 55c, and 55d. The other input of the OR gate 64, 66, 68 forms the second input of the respective XOR gate cell. The output of the OR gate 64, 66, 68 is coupled to the noninverting input of the AND gate 84, 86, 88, and the output of the AND gate forms the output of the XOR gate cell. If desired for ease of layout in integrated circuit form, the first XOR cell may be the same as the other XOR cells wherein the inverting input to the OR gate is coupled to ground.

As an example, if a metastable state is detected in input latch 44, a logic one is provided at the output of sense latch 54. The more significant bits, in this case there is only one—DIG1, are unaffected and remain at the previous logic state. Thus OR gate 64 receives a logic one from the output of sense latch 54 and an invalid or corrupted logic state from the output of input latch 44. The output of OR gate 64 is thus a logic one. Since in this example, no metastable state was detected in input latch 42, the output of sense latch 52 is a logic zero. Thus AND gate 84 receives an inverted logic zero from sense latch 52 and a logic one from OR gate 64 to produce a logic one at DIG2. Since a metastable state is an indication that the analog input signal and the reference signal at the inputs of comparator 12 are approximately equal, the remaining less significant bits need not be calculated and may be forced to a logic zero. Thus the logic one indication on the output of sense latch 54 is rippled down to the XOR gate cells 55c and 55d to force the inverting input of respective AND gates 86 and 88 to a logic one. The output of AND gates 86 and 88 is consequently a logic zero and thus less significant bits DIG3 and DIG4 are forced to a logic zero. Wired OR gates 74, 76, and 78 are shown only as an implementation that may be useful if ECL logic circuits are used to construct the logic circuit 55, input latches 42-48, and sense latches 52-58.

The output buffer stage 16 includes individual buffer stages 16a, 16b, 16c, and 16d that buffer the output of OR gate 62, and AND gates 84, 86, and 88 to provide logic bits DIG1, DIG2, DIG3, and DIG4 at terminals 24, 26, 28, and 30, respectively.

It is apparent to those skilled in the art that the four bit embodiment of the data acquisition system 50 shown in FIG. 3 may be extended to any number of bits If the number of bits selected is N, the corresponding data acquisition system ideally includes N input latches, N sense latches, and N XOR gate cells. The digital outputs DIG1 through DIGN represent the most significant bit through the least significant bit.

Figure 1:
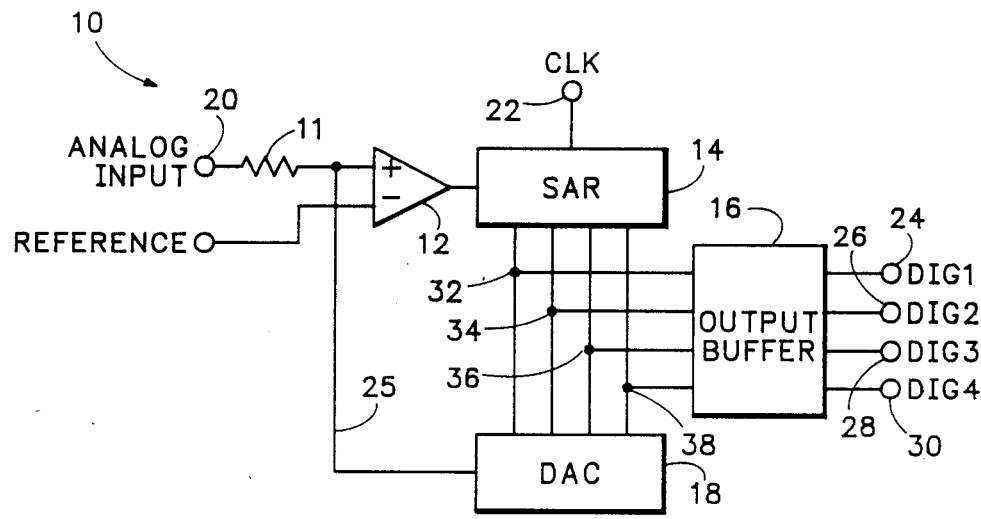
FIG. 1 is a simplified block diagram of a prior art SAR type A/D converter.
Figure 5:
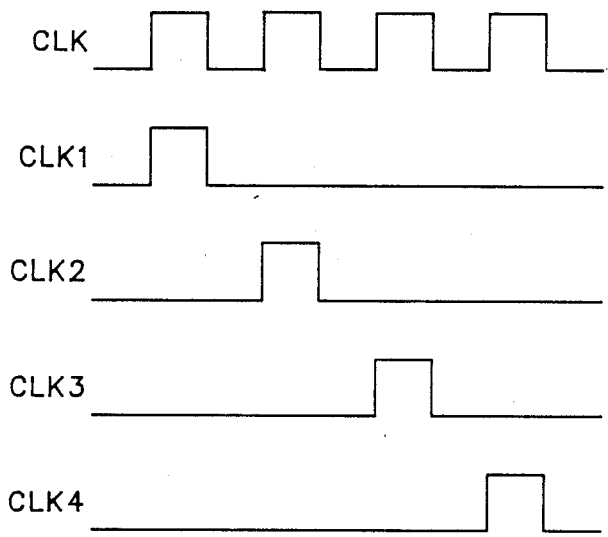
FIG. 5 is a timing diagram showing the time relationship between the master clock signal and the delayed strobe clock signals.
Figure 2:
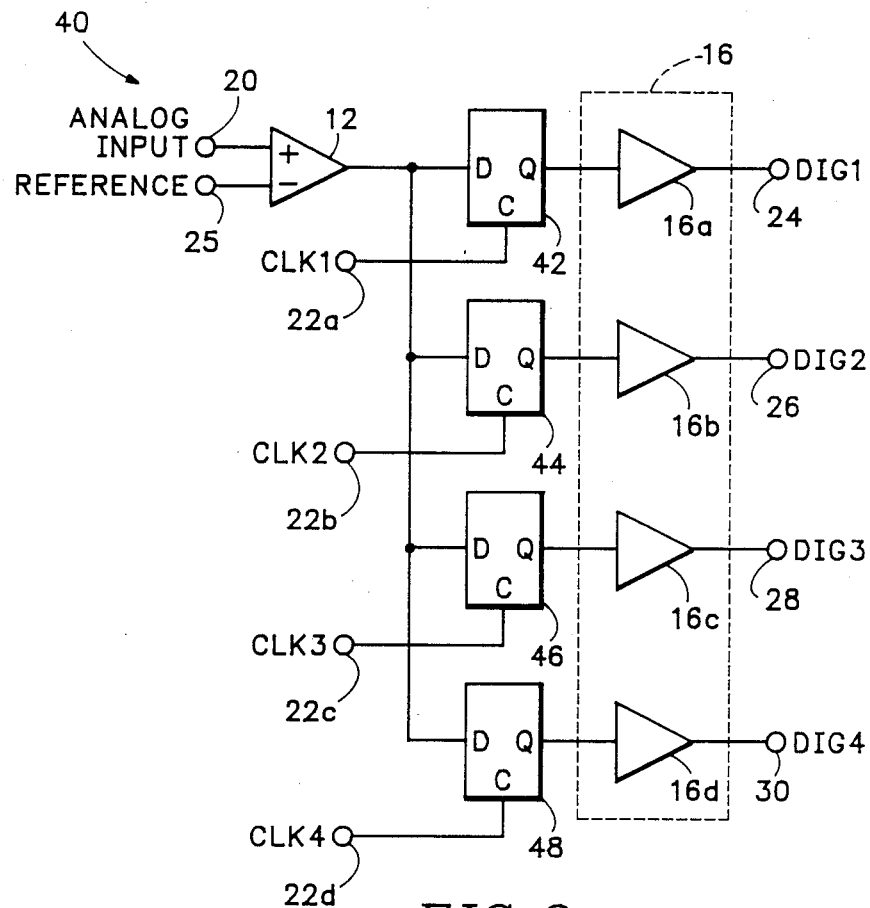
FIG. 2 is a block diagram of a prior art data acquisition system suitable for use in a SAR type A/D converter.
Figure 4:
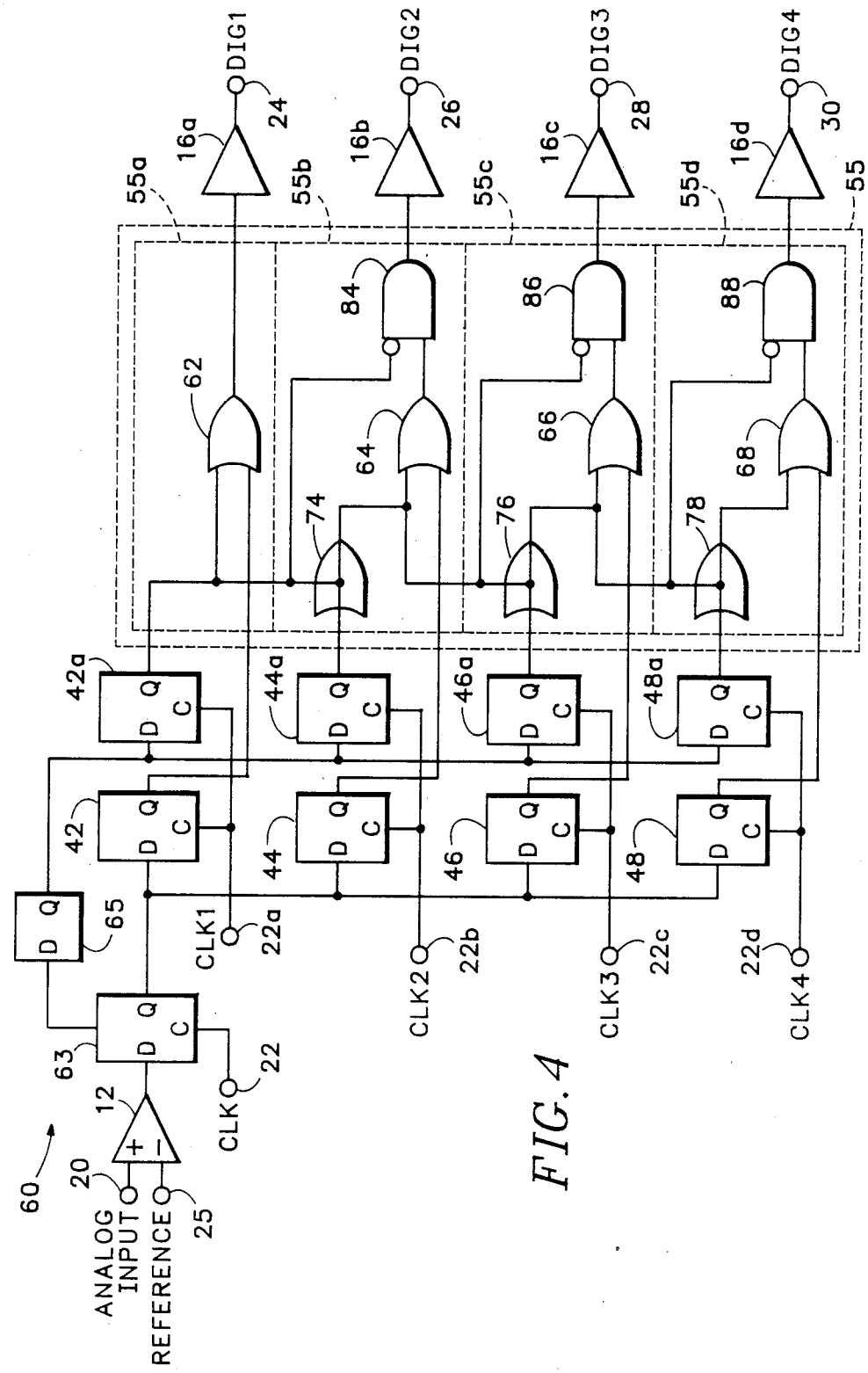
FIG. 4 is a schematic block diagram of a second embodiment of a data acquisition system having a metastable sense feature according to the present invention.

A second embodiment of the data acquisition system having a metastable sense feature is shown in FIG. 4. The data acquisition system 60 includes a D type master latch 63 having a D input for receiving a digital input signal from comparator 12 and a Q output. The comparator 12 has a positive input coupled to an analog input signal source through terminal 20 and a negative input coupled to a reference input signal source through terminal 25. The inputs of four input latches 42, 44, 46, 48 are coupled together and to the output of the master latch 63. The outputs of the input latches 42, 44, 46, 48 provide a first digital word in response to the digital output of comparator 12 and the logic state of delayed strobe clock signals CLK1, CLK2, CLK3, and CLK4 received on the clock input, C, of each respective input latch at terminals 22a-22d. Note that the master latch 63 receives a master clock input signal, CLK, on the C input at terminal 22. The master clock signal CLK is ideally a square wave, whereas the delayed strobe clock signals are pulsed signals having a period determined by the number of bits in the data acquisition system and delayed with respect to each other by one master clock cycle as shown in FIG. 5.

The data acquisition system 60 further includes a sense latch 65 having a Q input and a D output. A sense latch suitable for use in data acquisition system 60 is fully described in my copending patent application Ser. No. 450802. The input of sense latch 65 is coupled to the output or suitable sense node in the master latch 63 for sensing a metastable condition with the master latch 63.

Four secondary D type latches 42a, 44a, 46a, 48a, each has a D input and Q output. The inputs of the secondary latches 42a, 44a, 46a, 48a are coupled together and to the output of the sense latch 65. The outputs of the secondary latches provide a second digital work in response to the sensed metastable condition in the sense latch 65.

A logic circuit 55 is coupled to the outputs of the input latches 43, 44, 46, 48 and to the outputs of the secondary latches 42a, 44a, 46a, 48a, for passing the first digital word to the system output if no metastable condition is sensed in the master latch 63 and for providing a third digital word to the system output if a metastable condition is sensed in the master latch 63. The third digital word is defined by a logic one at the current bit output, the more significant bits are unaffected, and the less significant bits are forced to a logic zero, thus terminating the data acquisition of the current digital input signal.

As in the first embodiment, the logic circuit 55 of data acquisition system 60 includes four XOR gate cells 55a, 55b, 55c, and 55d each having a first input, a second input, and an output, the first input of each XOR gate being coupled together. The first input of the first XOR gate cell 55a is coupled to the output of the first input latch 42, and the second input is coupled to the output of the first secondary latch 42a, wherein the output of the XOR gate cell 55a represents the most significant bit of the third digital word. Similarly, the first input of the second XOR gate cell 55b is coupled to the output of the second input latch 44, and the second input is coupled to the output of the second secondary latch 44a, wherein the output of the XOR gate cell 55b represents the next most significant bit of the third digital word. The coupling of the XOR gate cells to the respective input and secondary latches continues to include the fourth XOR gate cell 55d. The first input of the fourth XOR gate cell 55d is coupled to the output of the fourth input latch 48, and the second input is coupled to the output of the fourth secondary input latch 48a, wherein the output of the fourth XOR gate cell 55d represents the least significant bit of the third digital word.

In similar fashion to the first embodiment, the logic circuit 55 operates by rippling the logic one indication from a secondary latch to less significant bit XOR cells. However, an important difference between the first and second embodiments is that a single master latch 63 and sense latch 65 exists for the purpose of detecting a sole metastable condition. Once the condition has been detected the logic one is latched in an appropriate secondary latch. The advantage of one master latch 63 and sense latch 65 is a consistency of metastable states for each bit is established by the switching threshold of master latch 63. A disadvantage to the data acquisition system 60 is that an extra master clock cycle is needed to clock the third digital word to the output.

In data acquisition system 60, since the most significant bit DIG1 is not affected by a more significant bit, the first XOR gate cell 55a is simply an OR gate 62 that passes either the output of input latch 42 or the output of secondary latch 42a. However, the remaining XOR gate cells 55b, 55c and 55d each include an OR gate 64, 66, and 68 and an AND gate 84, 86, 88 having a noninverting and an inverting input. The inverting input of each AND gate 84, 86, 88 is coupled to one input of the respective OR gate 64, 66, 68 to form the first input of the XOR gate cell 55b, 55c, and 55d. The other input of the OR gate 64, 66, 68 forms the second input of the respective XOR gate cell. The output of the OR gate 64, 66, 68 is coupled to the noninverting input of the AND gate 84, 86, 88, and the output of the AND gate forms the output of the XOR gate cell. AS in the first embodiment, the first XOR cell may the same as the other XOR cells wherein the inverting input to the OR gate is coupled to ground.

As an example, if a metastable state is detected in the master latch 63 during the acquisition of bit DIG2, a logic one is provided at the output of secondary latch 44a. The most significant bits, in this case there is only one—DIG1, are unaffected and remain at the previous logic state. Thus OR gate 64 receives a logic one from the output of secondary latch 44a and an invalid or corrupted logic state from the output of input latch 44.

The output of OR gate 64 is thus a logic one. Since in this example, no metastable state was detected during the acquisition of bit DIG1, the output of secondary latch 42a is a logic zero. Thus AND gate 84 receives an inverted logic zero from secondary latch 42a and a logic one from OR gate 64 to produce a logic one at DIG2. Since a metastable state is an indication that the analog input signal and the reference signal at the inputs of comparator 12 are approximately equal, the remaining less significant bits need not be calculated and may be forced to a logic zero. Thus the logic one indication on the output of secondary latch 44a is rippled down to the XOR gate cells 55c and 55d to force the inverting input of respective AND gates 86 and 88 to a logic one. The output of AND gates 86 and 88 is consequently a logic zero and thus less significant bits DIG3 and DIG4 are forced to a logic zero. Wired OR gates 74, 76 and 78 are shown only as an implementation that may be useful if ECL logic circuits are used to construct the logic circuit 55, input 42-48, and secondary latches 42a-48a.

As in the previous embodiment, an output buffer stage 16 includes individual buffer stages 16a, 16b, 16c, and 16d that buffer the output of OR gate 62, and AND gates 84, 86, and 88 to provide logic bits DIG1, DIG2, DIG3, and DIG4 at terminals 24, 26, 28, and 30, respectively.

It is apparent to those skilled in the art that the four bit embodiment of the data acquisition system 60 shown in FIG. 4 may be extended to any number of bits. If the number of bits selected is N, the corresponding data acquisition system ideally includes one master latch, one sense latch, N input latches, N secondary latches, and N XOR gate cells. The digital outputs DIG1 through DIGN represent the most significant bit through the least significant bit.

Thus is has been shown that a data acquisition system detects and acts upon a metastable condition, and that each bit of an acquisition requires no more than two clock cycles of a master clock signal. If a metastable condition is sensed during the acquisition of any bit, the acquisition is terminated prematurely since less significant bits are forced to a logic zero.

While I have shown and described the preferred embodiment of my invention, it is apparent to those skilled in the art that many changes and modifications may be made without departing from the invention in its broader aspects. For example, the number of bits need not be fixed at four, but may be any number necessary for a given application. Further the logic family used to construct the data acquisition system may be ECL or any other type of logic family that meets the specifications of the given application. The appended claims therefore cover all such changes and modification as fall therewithin.

I claim:

1. A data acquisition system having a metastable sense feature comprising:
   (a) a plurality of input latches each having an input and an output, the inputs of the input latches being coupled together to receive a digital input signal, the output of the input latches providing a first digital word;
   (b) a plurality of sense latches each having an input and an output, the inputs of the sense latches being coupled to a sense node in the respective input latch for sensing a metastable condition within each respective input latch, the outputs of the sense latches providing a second digital word; and
   (c) logic means coupled to the outputs of the input latches and to the outputs of the sense latches for passing the first digital word to a system output if no metastable condition is sensed in one of the input latches and for providing a third digital word to the system output if a metastable condition is sensed in one of the input latches.

2. A data acquisition system as in claim 1 wherein the plurality of input latches further comprises a clock input for respectively receiving a plurality of delayed strobe clock input signals.

3. A data acquisition system as in claim 1 wherein the plurality of input latches comprises N input latches and the plurality of sense latches comprises N sense latches, wherein the output of a first input latch represents a most significant bit, the output of a second input latch represents a next most significant bit, and the output of successive input latches represent less significant bits until the output of an Nth input latch a least significant bit, wherein N is an integer greater than one.

4. A data acquisition system as in claim 3 wherein the logic means comprises N XOR gate cells each having a first input, a second input, and an output, the first input of each XOR gate being coupled together,
   (a) a first XOR gate cell having the first input being coupled to the output of the first sense latch, the second input being coupled to the output of the first input latch, and the output representing a most significant bit of the third digital word;
   (b) a second XOR gate cell having the first input being coupled to the output of the second sense latch, the second input being coupled to the output of the second input latch, and the output representing a next most significant bit of the third digital word; the coupling of the XOR gate cells to the respective sense and input latches continuing to include,
   (c) an Nth XOR gate cell having the first input being coupled to the output of the Nth sense latch, the second input being coupled to the output of the Nth input latch, and the output representing a least significant bit of the third digital word.

5. A data acquisition system as in claim 4 wherein the first XOR gate cell comprises an OR gate.

6. A data acquisition system as in claim 4 wherein the second through the Nth XOR gate cells each comprise:
   (a) an OR gate having first and second inputs and an output; and
   (b) an AND gate having a noninverting input, an inverting input, and an output, the inverting input being coupled to the first input of the OR gate to form the first input of the XOR gate cell, the second input of the OR gate forming the second input of the XOR gate cell, the output of the OR gate being coupled to the noninverting input of the AND gate, and the output of the AND gate forming the output of the XOR gate cell.

7. A data acquisition system as in claim 4 further comprising buffer output means coupled to the output of each of the XOR gate cells.

8. A data acquisition system having a metastable sense feature comprising:
   (a) a master latch having an input for receiving a digital input signal and an output;
   (b) a plurality of input latches each having an input and an output, the inputs of the input latches being coupled together and to the output of the master latch, the outputs of the input latches providing a first digital word;

(c) a sense latch having an input coupled to a sense node in the master latch for sensing a metastable condition within the master latch and an output;

(d) a plurality of secondary latches each having an input and an output, the inputs of the secondary latches being coupled together and to the output of the sense latch, the outputs of the secondary latches providing a second digital word; and (e) logic means coupled to the outputs of the input latches and to the outputs of the secondary latches for passing the first digital word to a system output if no metastable condition is sensed in the master latch and for providing a third digital word to the system output if a metastable condition is sensed in the master latch.

9. A data acquisition system as in claim 8 wherein the plurality of input latches further comprises a clock input for respectively receiving a plurality of delayed strobe clock input signals.

10. A data acquisition system as in claim 8 wherein the plurality of secondary latches further comprises a clock input for respectively receiving a plurality of delayed strobe clock input signals.

11. A data acquisition system as in claim 8 wherein the master latch further comprises a clock input for receiving a master clock signal.

12. A data acquisition system as in claim 8 wherein the plurality of input latches comprises N input latches and the plurality of secondary latches comprises N sense latches, wherein the output of a first input latch represents a most significant bit, the output of a second input latch represents a next most significant bit, and the output of successive input latches represent less significant bits until the output of an Nth input latch represents a least significant bit, wherein N is an integer greater than one.

13. A data acquisition system as in claim 12 wherein the logic means comprises N XOR gate cells each having a first input, a second input, and an output, the first input of each XOR gate being coupled together, (a) a first XOR gate cell having the first input being coupled to the output of the first secondary latch, the second input being coupled to the output of the first input latch, and the output representing a most significant bit of the third digital word;

(b) a second XOR gate cell having the first input being coupled to the output of the second secondary latch, the second input being coupled to the output of the second input latch, and the output representing a next most significant bit of the third digital word; the coupling of the XOR gate cells to the respective secondary and input latches continuing to include (c) an Nth XOR gate cell having the first input being coupled to the output of the Nth secondary latch, the second input being coupled to the output of the Nth input latch, and the output representing a least significant bit of the third digital word.

14. A data acquisition system as in claim 13 wherein the first XOR gate cell comprises an OR gate.

15. A data acquisition system as in claim 13 wherein the second through the Nth XOR gate cells each comprise:

(a) an OR gate having first and second inputs and an output; and (b) an AND gate having a noninverting input, an inverting input, and an output, the inverting input being coupled to the first input of the OR gate to form the first input of the XOR gate cell, the second input of the OR gate forming the second input of the XOR gate cell, the output of the OR gate being coupled to the noninverting input of the AND gate, and the output of the AND gate forming the output of the XOR gate cell.

16. A data acquisition system as in claim 13 further comprising buffer output means coupled to the output of each of the XOR gate cells.

* * * * *